(12) United States Patent
Ikegami et al.

(10) Patent No.: US 6,617,688 B2
(45) Date of Patent: Sep. 9, 2003

(54) SEMICONDUCTOR DEVICE AND FLAT ELECTRODES

(75) Inventors: Gorou Ikegami, Shiga (JP); Nobuaki Nagai, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/106,491

(22) Filed: Mar. 27, 2002

(65) Prior Publication Data

US 2002/0140066 A1 Oct. 3, 2002

(30) Foreign Application Priority Data

Mar. 27, 2001 (JP) .......................... 2001-089614

(51) Int. Cl.[7] .................. H01L 23/52; H01L 23/48; H01L 29/40
(52) U.S. Cl. ................ 257/738; 257/777; 257/780
(58) Field of Search ........................ 257/777, 693, 257/737, 738, 584, 773, 780; 438/613; 228/180.22

(56) References Cited

U.S. PATENT DOCUMENTS 4,693,770 A * 9/1987 Hatada ............... 228/180.22
4,818,728 A * 4/1989 Rai et al. .................... 438/613
6,462,420 B2 * 10/2002 Hikita et al. ................ 257/777

FOREIGN PATENT DOCUMENTS

| JP | 62-156827 | 7/1987 |
| JP | 2-5540 | 1/1990 |
| JP | 5-13663 | 1/1993 |
| JP | 11-135537 | 5/1999 |
| JP | 11-163256 | 6/1999 |
| JP | 2000-232200 | 8/2000 |

* cited by examiner

*Primary Examiner*—Jasmine J B Clark
(74) *Attorney, Agent, or Firm*—Young & Thompson

(57) ABSTRACT

A semiconductor device has a first semiconductor pellet and a second semiconductor pellet. An electrode-forming surface of the first semiconductor pellet on which flat electrodes having flat surfaces are formed and an electrode-forming surface of the second semiconductor pellet on which protruded electrodes are opposed to each other. Also, the flat electrodes and the protruded electrodes are electrically connected to each other. A main component of a conductive material that forms the flat electrode is the same as a main component of a conductive material that forms the protruded electrode. Furthermore, the hardness of the protruded electrode is higher than the hardness of the flat electrode. Therefore, the protruded electrodes and the flat electrodes can be electrically connected to each other with high reliability.

9 Claims, 4 Drawing Sheets

SEMICONDUCTOR DEVICE AND FLAT ELECTRODES

BACKGROUND OF THE INVENTION

1. Field of the Invention

The present invention relates to a semiconductor device in which a first semiconductor pellet is placed on a second semiconductor pellet to make an electric connection with each other.

2. Description of the Prior Art

Electronic components to be used in compact and lightweight portable electronic devices such as cellular phones have been miniaturized, or the packing density thereof have been increased without miniaturizing their bodies to substantially contribute the miniaturization of electronic devices. In addition, compact and lightweight high-functional semiconductor devices with large packing densities have been realized by integrating two or more semiconductor pellets that form integrated circuits having different functions therein, such as those of CPUs and memories.

An example of such conventional semiconductor devices will be now described with reference to FIG. 5. In the figure, the reference numeral 1 denotes a first semiconductor pellet in which a plurality of flat electrodes 3 is formed on one side of a first semiconductor substrate that includes semiconductor elements (not shown) in its inside. In addition, electrodes (not shown) for external connection are formed on the periphery of that side of the first semiconductor pellet 1 or formed on the other side thereof. Furthermore, the reference numeral 4 denotes a second semiconductor pellet that comprises a second semiconductor substrate 5 with a diameter smaller than that of the first semiconductor substrate 2. Also, there are protruded electrodes 6 mounted on one side of the second semiconductor substrate 5 such that the protruded electrodes 6 face to the flat electrodes 3, respectively. Accordingly, the first and second semiconductor substrates 2, 5 make up a semiconductor device 7 by facing their electrode-formed sides to each other such that each electrode of one substrate is placed over the corresponding electrode of the other substrate, followed by heating and pressurizing these superimposed portions to make an electrical connection between these substrates 2, 5.

A method for fabricating such a semiconductor device 7 will be described.

At first, as shown in FIG. 6, a first semiconductor pellet 1 is prepared. As shown in the figure, one side of a first semiconductor substrate 2 is covered with an insulating film 8 having a main part formed as an opening portion. Then, flat electrodes 3 are formed on the semiconductor substrate 2. That is, an aluminum layer 3a is formed in the opening portion of the insulating film 8 and is electrically connected to an internal circuit (not shown) in the first semiconductor pellet 1. In addition, a barrier metal(e.g., titanium or nickel) layer 3b is formed on the aluminum layer 3a. Furthermore, the surface of the titanium layer 3b is covered with a gold layer 3c to facilitate its external connection. In this manner, two or more flat electrodes 3 are provided in a ring form on the main surface of the semiconductor pellet 1.

Next, as shown in FIG. 7, a second semiconductor pellet 4 is prepared. Just as with the first semiconductor substrate 2, one side of a second semiconductor substrate 5 is covered with an insulating film 9. The insulating film 9 has a main part formed as an opening portion where a protruded electrode 6 is formed on the semiconductor substrate 5. That is, an aluminum layer 6a is formed in the opening portion of the insulating film 9 on which a stepped electrode 6b is provided. In this example, the electrode 6b is prepared by melting the tip of a gold wire to shape it like a ball and pressing the ball-shaped tip of the gold wire by the bottom end of a capillary followed by pulling out the gold wire around the pressed portion so as to form the stepped electrode 6b having a large-diameter base portion on the side of the semiconductor substrate 5 and a small-diameter tip portion extending from the base portion.

Subsequently, as shown in FIG. 8, the semiconductor pellet 1 of FIG. 6 is exactly placed on a predetermined position on a stage 10 being heated. Thus, the flat electrode 3 is heated at a predetermined temperature (e.g., 200 degrees centigrade to 300 degrees centigrade). On the other hand, as shown in FIG. 9, the second semiconductor pellet 4 is held by a suction collet 11 and is then properly aligned with the first semiconductor 1. Then, the collet 11 brings down the semiconductor pellet 4 to make each connection between the electrodes 3, 6. The collet 11 comprises a heating means (not shown) to heat the protruded electrode 6 at a predetermined temperature (e.g., 200 degrees centigrade to 300 degrees centigrade).

More concretely, the arrangement of the semiconductor pellet 4 in place can be performed as follows. At first, the suction collet 11 moves up and down by a pellet-supplying portion (not shown) to hold the semiconductor pellet under suction. Then, the position of the protruded electrode 6 is recognized by a visual monitoring system (not shown) at a middle position where the collet 11 can be laterally moved to correct the amount of deviation from alignment with the corresponding flat electrode 3 being arranged in place. Subsequently, the second semiconductor pellet 4 is brought down to the first semiconductor pellet 1, while the collet 11 keeps its sucking state at a predetermined pressure. Consequently, the alignment between the semiconductor pellets 1, 4 is completed. After the alignment, the suction collet 11 moves downward such that the second electrode 6 is brought into contact with the first electrode 3. Subsequently, the suction collet 11 further moves downward to make a press-contact between the first and second electrodes 3, 6. At this time, the overall force to which the protruded electrode 6 is subjected in resisting the presscontact is concentrated onto the small-diameter tip portion (.e., an extremely small surface area) of the electrode 6 as such a portion is in the shape of a paraboloid of revolution. As a result, the small-diameter tip portion of the electrode 6 is crushed in its axial direction and is pressed into the flat electrode 3 while the periphery of the tip portion is extended outward. In other words, the electrodes 3, 6 are pressed through the addition of heat and then extended outwardly at their contact surfaces to make an electrical contact between them, resulting in a semiconductor device 7 shown in FIG. 5. After that, the suction collet 11 releases the second semiconductor pellet 4 and the application of heat is stopped. Then, the suction collet 11 moves upward to allow the removal of the semiconductor device 7 as a singlepiece construction of the first and second semiconductor pellets 1, 4 from the heating stage 10. Alternatively, but not shown in the figure, the semiconductor device 7 may be prepared by sealing between the first and second semiconductor pellets 1, 4 with a resin as needed. Such a construction protects any wiring layer (not shown) formed on the facing sides of these pellets 1, 4 from outside air. As shown in the figure, the outer diameter of the first semiconductor pellet 1 is larger than that of the second semiconductor pellet 4, so that the outer diameter of the semiconductor device 7 in a plane view can be determined by the outer diameter of the first one. On the other hand, the thickness of the semiconductor device 7 can be determined by the total thickness of two semiconductor pellets 1, 4 including the electrodes 3, 6. Accordingly, the semiconductor device 7 can be miniaturized and thinned.

The semiconductor device 7 thus obtained can be solely surface-mounted on a printed circuit board as disclosed in publications such as Japanese Patent Application Laying-open Nos. 5-13663 (1993) and 11-135537 (1999). Alternatively, as disclosed in other publications such as Japanese Patent Application Laying-open Nos. 11-163256 (1999) and 2000-232200, a resin-molded type electronic component can be manufactured by mounting the semiconductor device 7 on a lead frame, electrically connecting the externally-extended electrodes of the semiconductor device 7, which are formed on the periphery of the semiconductor pellet 1, with the corresponding leads of the lead frame, covering the main parts on the lead frame including semiconductor pellets 1, 4 with a resin to form an outer-cladding resin, and removing an undesired portion exposed from the outer-cladding resin, followed by cutting the lead frame into individual resin-molded type electronic components. In the figure, but not limited to, there is one second semiconductor pellet 4 on the first semiconductor pellet 1. Alternatively, two or more small-diameter semiconductor pellets may be formed on a large-diameter semiconductor pellet.

In addition to the thermo-compression bonding illustrated in FIGS. 6 to 9, other bonding methods can be applied for the connection between the electrodes 3, 6 of the semiconductor device 7 shown in FIG. 5. Such methods include the ultrasonic treatment in which ultrasonic waves are applied on the suction collet 11 and the combination of thermo-compression bonding and ultrasonic treatment for electrically connecting these electrodes 3, 6. In each of these methods, the degree of bonding between the electrodes 3, 6 can be changed depending on the loads on the electrodes 3, 6. If the load is too small, it is clear that the degree of bonding becomes poor. If the load is too high, in addition, it is clear that the reliability of the semiconductor device 7 becomes poor because of the damages on the semiconductor substrates 2, 5. Therefore, the load to be applied on each of the electrodes 3, 6 is generally defined such that a sufficient shear strength can be obtained without losing an electric connection between the electrode and the semiconductor substrate by applying pressure on one side of the second semiconductor electrode 2 while fixing the first semiconductor pellet 1 in place and estimating a maximum pressure (i.e., shear strength) just before the separation between the electrodes 3, 6 using the load to be applied between the electrodes 3, 6 as a parameter.

In the configuration of the above semiconductor device 1, each of the semiconductor pellets 1, 4 generates heat during its operation. The heat can be transmitted to the outer surface thereof to dissipate heat into the outside. In this case, however, the generation of heat causes a rapid increase in temperature of the facing portion of each semiconductor pellet 1, 4 which is thermally connected to the other through the electrodes 3, 6 having high thermal conductivities. In addition, the generation of heat causes a large difference between the active and rest states of such a portion with respect to its thermal expansion. As a result, a lot of stress can be applied on the contact between the electrodes 3, 6. Furthermore, it is noted that there are variations in the heights of each set of the flat and protruded electrodes 3, 6. Especially, there are large variations in the heights of the protruded electrodes 6 formed from the molten ball compared with those of the flat electrodes 3 generally formed by means of plating.

Such variations in the heights of the electrodes 6 cause the time lags with respect to the contacts between the electrodes 6 and their respective electrodes 3. In other words, all of the protruded electrodes 6 can be electrically connected to their respective flat electrodes 3. Relatively higher protruded electrodes 6 can be pressed on their respective electrodes 3 at first and they can be crushed to expand their peripheral portions outward to bring the first semiconductor pellet 1 close to the second semiconductor pellet 4. Therefore, the relatively shorter protruded electrodes 6 can be brought into contact with their respective flat electrodes 3. In this case, however, there is a possibility of causing insufficient bonding strength between the electrodes 3, 6 if many of the electrodes 6 touches on their respective electrodes at first. In this case, that is, the pressure being applied on the semiconductor pellet 1 reaches to the predetermined load before bringing the rest of the electrodes 6 into contact with the rest of the electrodes 3. Thus, there is no additional increase in the load, so the pressure to be applied on the semiconductor pellet 1 can be remained at a constant. As a result, in spite of attaining an electrical connection between the electrodes 3, 6 at a later time, a bonding strength between the electrodes 2, 6 connected at a later time becomes poor.

If a lot of stress is repeatedly applied on the connection portion having such a poor bonding strength, the electrodes 3, 6 can be peeled off from each other at their bonding portions, causing an unstable electrical connection between the electrodes 3, 6. Consequently, there is a problem that the semiconductor device 7 fails to work properly or generates noises under vibrations or physical impacts.

Regarding the connection structure between the electrodes, Japanese Patent Application Laying open No. 62-156827 (1987) discloses a TAB-type semiconductor device in which bumps(protruded electrodes) having different hardness are formed on each of semiconductor pellets and a lead frame so as to place a relatively hard bump into a relatively soft bump. In this case, the lead frame can be allowed to undergo displacement depending on the deformation of each electrode of the semiconductor pellet after the connections between the bumps, so that stress depending on the variations of thermal expansion can be ignored. However, the technology disclosed in the above Japanese Patent Application Laying-open No. 62-156827 (1987) cannot be directly applied on the semiconductor device shown in FIG. 5 because of the following reasons. In the case of the semiconductor device shown in FIG. 5, the semiconductor pellets are bonded to each other. Thus, a rapid increase in temperature can be caused as a result of failing to escape heat from the boundary between the electrodes. In addition, each electrode is fixed on the semiconductor pellet without allowing its displacement.

Another structure of an electrical connection is disclosed in FIGS. 1 to 3 and their explanations of Japanese Patent Application Laying-open No. 2-5540(1990). In this reference, the electrical connection structure comprises: a relatively soft bump electrode 3 which is made of indium; and a relatively hard bump electrode prepared by covering a copper electrode 5 having a diameter smaller than that of the bump electrode 3 with an indium film 6. The relatively hard bump electrode is arranged so as to dig into the relatively soft bump electrode 3. However, the connection between different metals such as indium and copper tends to form an intermetallic compound, becoming breakable. Therefore, if each of the opposed semiconductor pellets connected to each other through their electrodes shows different heat generation under operation conditions, the large stress is applied on the connected electrodes by the thermal expansion of each electrode. Therefore, it becomes difficult to keep the electrical connection between the electrodes at the bonding portion on which the intermetallic compound is formed.

SUMMARY OF THE INVENTION

It is therefore an object of the present invention is to provide a semiconductor device capable of implementing electrodes formed on a first semiconductor pellet and electrodes formed on a second semiconductor pellet which are electrically connected to each other with reliability and with high packing density.

A semiconductor device in accordance with the present invention comprises:

a first semiconductor pellet having at least a flat electrode; and a second semiconductor pellet having at least a protruded electrode directly connected with said flat electrode;

wherein a main component of a conductive material of the protruded electrode is the same as a main component of a conductive material of the flat electrode, and the hardness of the protruded electrode is higher than the hardness of the flat electrode.

In the above configuration of the semiconductor device, the hardness of the protruded electrode is higher than the hardness of the flat electrode. Therefore, the tip portion of the protruded electrode can be easily inserted into the flat electrode. In addition, the main component of the conductive material of the flat electrode is the same as that of the protruded material, so that the strong electrical connection between the protruded electrode and the flat electrode can be attained.

Here, the flat electrode may be made of a conductive material subjected to an annealing treatment.

In such a configuration of the semiconductor device, the conductive material decreases the hardness of the flat electrode.

Furthermore, at least one of the protruded electrode and the flat electrode may be a plated electrode so as to cause the difference between the hardness of the flat electrode and the hardness of the protruded electrode.

In such a configuration of the semiconductor device, the electrode having the desired hardness can be obtained by controlling a crystal grain size or a crystal shape of the electrode material to be formed with plating depending on plating conditions such as the temperature of a plating solution and the current density.

These and other objects of the present invention will be apparent to those of skill in the art from the appended claims when read in light of the following specification and accompanying figures.

DETAILED DESCRIPTION OF PREFERRED EMBODIMENTS

Figure 1:
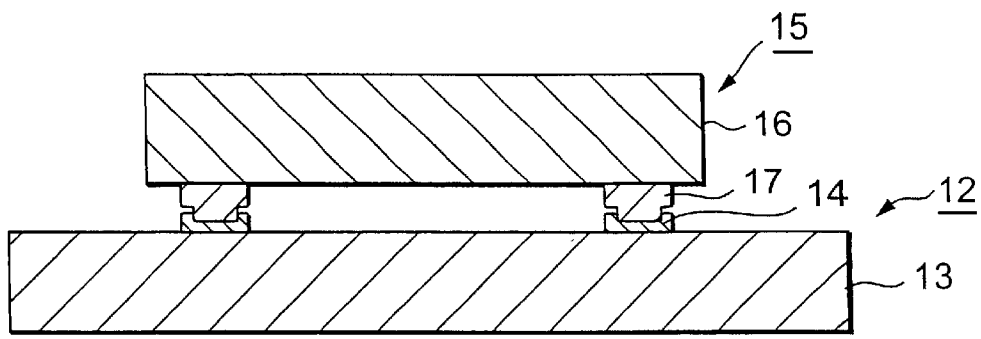
FIG. 1 is a cross sectional side view of the semiconductor device as one of preferred embodiments of the present invention.
Figure 5:
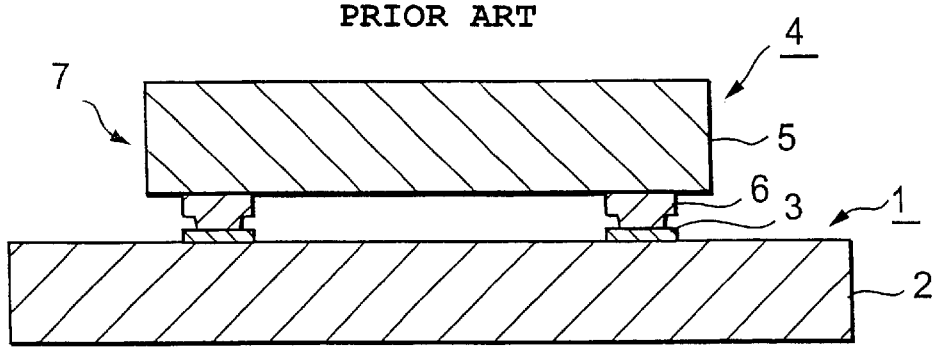
FIG. 5 is a cross sectional side view of the semiconductor device having a structure in which semiconductor pellets are stacked in layers.
Figure 6:
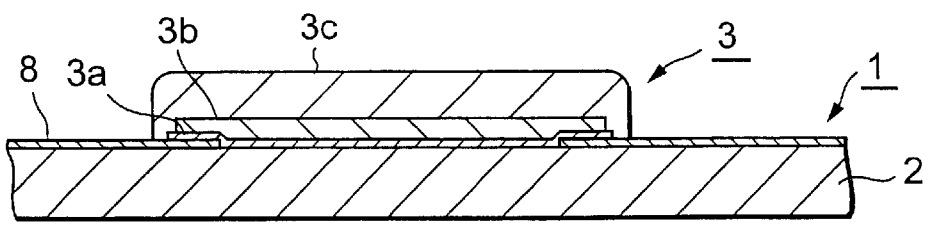
FIG. 6 is a cross sectional side view of the flat electrode to be used in the semiconductor device shown in FIG. 5.
Figure 7:
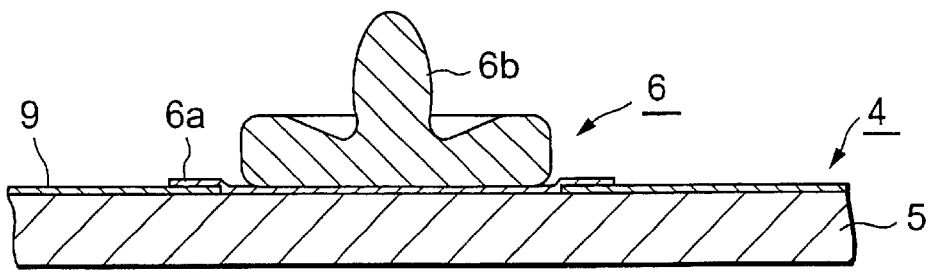
FIG. 7 is a cross sectional side view of the protruded electrode to be used in the semiconductor device shown in FIG. 5.
Figure 8:
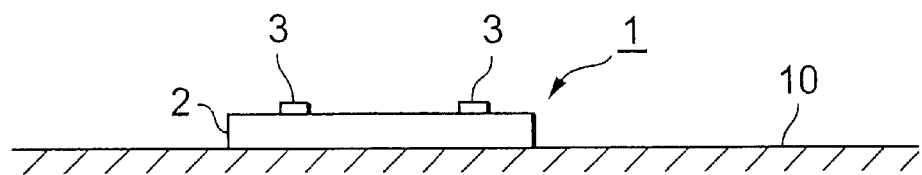
FIG. 8 is a cross sectional side view for illustrating the method for fabricating the semiconductor device shown in FIG. 5.
Figure 9:
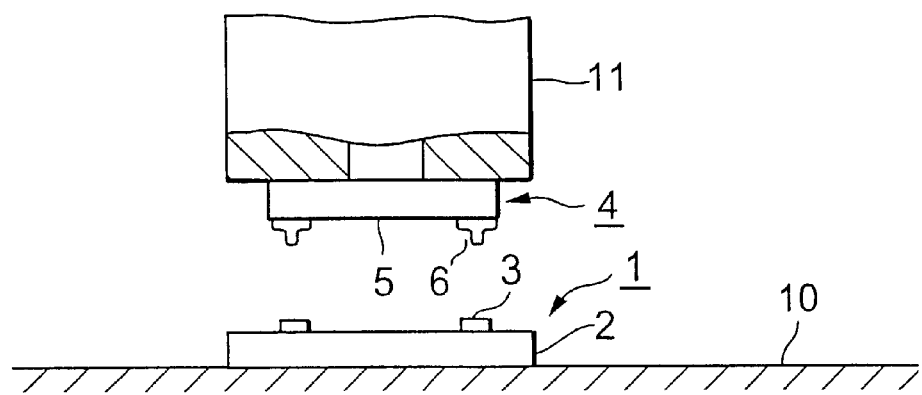
FIG. 9 is a cross sectional side view for illustrating the method for fabricating the semiconductor device shown in FIG. 5.

Referring now to FIG. 1, a semiconductor device as one of preferred embodiments of the present invention will be described. In the figure, the semiconductor device comprises a first semiconductor pellet 12 and a second semiconductor pellet 15. The first semiconductor pellet 12 includes a semiconductor substrate 13 having a surface on which a plurality of flat electrodes 14 is formed. The second semiconductor pellet 15 includes a semiconductor substrate 16 having a surface on which a plurality of protruded electrodes 17 is formed. Just as in the case of the conventional semiconductor device shown in FIG. 5, each of the protruded electrodes 17 is prepared by pressing the ball-shaped tip of a gold wire by any means and pulling out the gold wire around the pressed portion so as to form the stepped electrode having a large-diameter base portion on the side of the semiconductor substrate 16 and a small-diameter tip portion extending from the base portion. The first and second semiconductor pellets 12, 15 are arranged so as to be faced to each other, followed by connecting each protruded electrode 17 with its corresponding electrode 14 and pressing the connected portion to make an electrical connection. In contrast to the above conventional semiconductor device, the semiconductor device of the present embodiment is characterized in that the hardness of the protruded electrode 17 is higher than that of the flat electrode 14 and the diameter of the tip portion of the protruded electrode 17 is smaller than that of the diameter of the flat electrode 14. The tip portion of the protruded electrode 17 is inserted into the flat electrode 14 and is then pressed to outwardly expand the periphery of the tip portion. Thus, the contact surfaces of the respective electrodes 14, 17 can be mutually defused to each other to make an electrical connection between them.

For inserting the tip portion of the protruded electrode 17 into the flat electrode 14, the difference between the hardness of the flat electrode 14 and the hardness between the protruded electrode 17 may be at least 20 Hv (Vickers hardness). If the hardness of the flat electrode 14 is in the range of 40 to 60 Hv, then the hardness of the protruded electrode 17 can be defined in the range of 60 to 90 Hv. Therefore, when the relatively hard protruded electrode 17 is inserted into the relatively soft flat electrode 14, the tip portion and the opposite portion of the protruded electrode 17 apply the pressure to the semiconductor substrate 13 through the flat electrode 14, while the pressure applied on the periphery of the tip portion of the protruded electrode 17 is dispersed in the radial direction.

The pressure to be applied on the semiconductor substrate 13 from the protruded electrode 17 can be lessened by setting the thickness of the flat electrode 14 to the depth of press-insertion of the protruded electrode 17 or more to prevent the fracture of the basic material of the semiconductor substrate 13 under an aluminum layer (not shown) and to prevent the damage on each of the electrodes 14, 17.

The depth of press-insertion of the protruded electrode 17 (i.e., the distance below the surface of the flat electrode at which the tip of the protruded electrode 17 has reached) can be defined on the basis of both the harness of the electrode 14 and the hardness of the electrode 17 when the shapes and dimensions of the electrodes 14, 17 and the pressure to be applied on the protruded electrode 17 are constant. In this embodiment, but not limited to, each of flat electrodes 14 formed on the first semiconductor pellet 12 may be made of a gold plate of 100 micro meters in length, 20 micro meters in thickness, and 40 Hv in hardness. On the other hand, each of protruded electrodes 17 formed on the second semiconductor pellet may be prepared by melting the tip of a gold wire to shape it like a ball, pressing the ball-shaped tip of the gold wire onto the semiconductor substrate 16, and cutting the gold wire at the neighborhood of the gold ball. The resulting protruded electrode 17 has a large-diameter portion (i.e., a base portion) on the side of the semiconductor substrate 16 and a small-diameter portion extending from the base portion. The large-diameter portion may be of 70 to 80 micro meters in diameter and 20 to 25 micro meters in height, and the small-diameter portion may be of 25 micro meters in diameter and 50 to 55 micro meters in height. Such a protruded electrode 17 can be prepared as an alloy having a hardness of 90 Hv by mixing 99% or more gold with 1% or less precious metal such as palladium.

Then, the first semiconductor pellet 15 having protruded electrodes 17 having different-diameter portions is arranged so as to opposite to the second semiconductor pellet 12 on which flat electrodes 14 are formed. A pressure of about 0.1 to 0.9 N (10 to 60 gf) is applied on each of protruded electrodes 17. As a result, the small-diameter portion of the protruded electrode 17 is shrunk to become one having a height of about 30 micro meters. Simultaneously, the small-diameter portion of the protruded electrode 17 expands in a horizontal direction to become one having a diameter of about 30 micro meters, while the tip of the small-diameter portion is forced into the flat electrode 14 and is then placed at a distance of 5 to 7 micro meters below the top surface of the flat electrode 14. Under such conditions, the space between the tip portion of the protruded electrode 17 being pressed and expanded and the surface of the semiconductor substrate 16 can be constantly kept at 13 micro meters or more. In addition, the tip portion of the protruded electrode 17 becomes circular in cross section by the application of pressure, so that the pressure vertically-applied on the protruded electrode 17 changes in direction at the pressed tip portion and disperses in a radial direction to extend over the wide area on the surface of the semiconductor substrate 16, preventing the semiconductor substrate 13 from damaging.

Furthermore, the protruded electrodes 17 and the flat electrodes 14 prepared using the same material (i.e., gold) as their main structural components, so that there is no possibility of causing any intermetallic compound or the like. Consequently, the strong electric connection between the electrodes 14, 17 can be kept.

Figure 2:
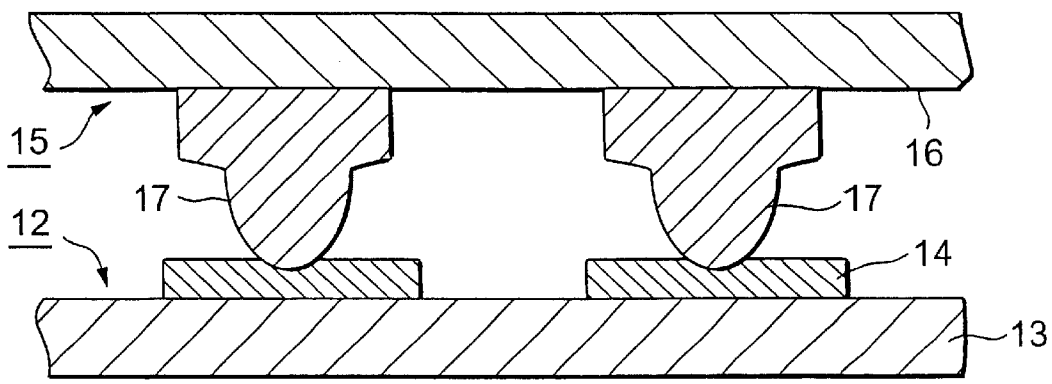
FIG. 2 is an enlarged sectional side view of a main part of the semiconductor device, where protruded electrodes and flat electrodes are connected to each other.
Figure 3:
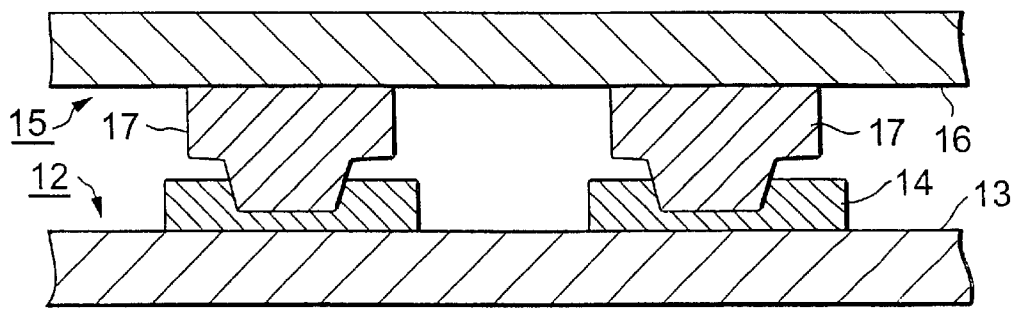
FIG. 3 is an enlarged sectional side view of the main part of the semiconductor device, where protruded electrodes and flat electrodes are connected to each other.

On the other hand, if there are variations in the heights of the protruded electrodes 17, the tips of the protruded electrodes 17 moves closer to and touches on their respective flat electrodes 14 at different times, respectively. The tip of the protruded electrode 17 touched on the flat electrode 14 at first is inserted into the flat electrode 14 as the pressure is concentrated on that tip. At this stage, the tip of the protruded electrode 17 may be not so crushed. As the semiconductor device 14 moves downward, as shown in FIG. 2, the tip of the protruded electrode 17 is further inserted into the flat electrode 14, while it becomes compressed in a vertical direction and simultaneously expanded in a radial direction. Subsequently, as shown in FIG. 3, the tip of the following protruded electrode 17 moves closer to and touches on another flat electrode 14, followed by being pressed into the flat electrode 14. In this manner, all of the protruded electrodes 17 can be finally inserted into their respective flat electrodes 14 by compressing the tip portion of the protruded electrode 17 in its axial direction while expanding the periphery portion of the protruded electrode 17 in its radial direction. If the load being applied on the semiconductor pellet 15 reaches to the predetermined load, this state can be kept for a predetermined time period. The friction between electrodes 14, 17 is occurred under heat to facilitate their mutual dispersions to make a stable electrical connection between the electrodes 14, 17.

Figure 4:
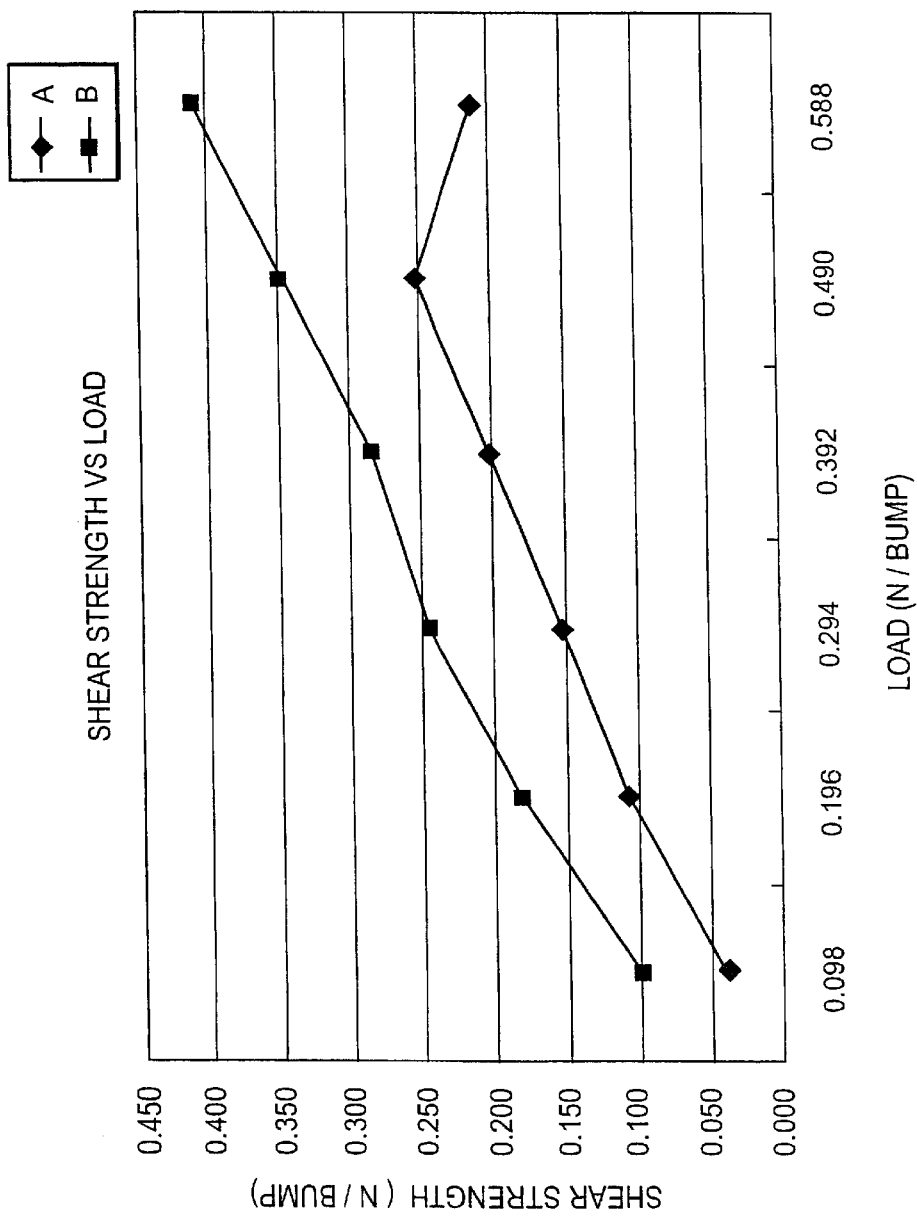
FIG. 4 is a characteristic diagram for illustrating the bonding strength between the electrodes of the semiconductor device.

FIG. 4 is a graph that illustrates the variations in shear strength for one semiconductor pellet on which 312 electrodes having the above dimensions and shape are mounted, when the load applied on one electrode is changed from about 0.1 to 0.59N. In the figure, "A" denotes a characteristic carve when the stage temperature is set to 200 degrees centigrade and the suction-collet temperature is set to 200 degrees centigrade; and "B" denotes a characteristic curve when the stage is set to 300 degrees centigrade and the suction-collet temperature is set to 300 degrees centigrade, respectively. As is evident from the figure, the characteristic curve "A" in which the temperature on the side of the protruded electrodes 17 is set to 300 degrees centigrade is superior to the characteristic curve "B". By increasing the temperature 100 degrees centigrade, the load can be decreased about 0.15 N (15 gf) and thus the damage on the semiconductor device can be also decreased.

According to the present invention, as described above, the protruded electrode is constructed such that the diameter of the tip portion thereof is smaller than the diameter of the flat electrode. In addition, the hardness of the protruded electrode and the hardness of the flat electrode are properly defined with respect to each other. Therefore, the protruded electrodes and the flat electrodes can be properly connected to each other without causing any damage on the semiconductor substrate even though there are some variations in the heights of the protruded electrodes. Thus, the present invention can be also applied on the semiconductor pellet on which a large number of electrodes with relatively small diameter is mounted, so that the semiconductor device with high packing density can be realized.

In the above embodiment, furthermore, the protruded electrode and the flat electrode are mainly comprised of the same conductive material such as gold or gold alloy. According to the present invention, alternatively, the protruded electrode and the flat electrode may be mainly comprised of the same material but different hardness. Any one of materials having excellent conductivity such as gold, copper, or silver may be used. Furthermore, a plating treatment may be applied on the protruded electrode just as in the case of the flat electrode. For instance, a resist film with a thickness almost equal to the height of the protruded electrode is formed on the semiconductor substrate (semiconductor wafer) and the resist film is then etched to form an opening with a diameter smaller than that of the flat electrode. Subsequently, an electrode material is deposited on the inside of the opening by plating, followed by removing the resist film from the semiconductor substrate. In addition, it is preferable to make the flat electrode into which the protruded electrode can be inserted may be comprised of soft gold or an alloy mainly including gold. In this case, the hardness of the gold or alloy may be equal to the hardness of the protruded electrode. Furthermore, in the case of constructing the flat electrode and the protruded electrode from the same material, the flat electrode can be softened more than the hardness of the protruded electrode by annealing the flat electrode. In the case of forming the flat electrode by means of plating, the hardness of the flat electrode varies as a crystal grain size or a crystal shape varies depending on plating conditions such as the temperature of a plating solution and the current density. In the case of gold, if the current density is a standard level, then the gold material becomes a globular crystal structure regardless of the plating temperature, resulting in a hardness of 40 to 60 Hv. If the current density is higher than a standard level and the temperature of the plating solution is comparatively high, i.e., in the order of 60 degrees centigrade, then the gold material becomes a polygonal crystal structure, resulting in a hardness of 60 to 80 Hv. If the current density is higher than a standard level and the temperature of the plating solution is comparatively low, i.e., in the order of 45 degrees centigrade, then the gold material becomes a needle crystal structure, resulting in a hardness of 100 Hv or more. Therefore, the hardness of the electrode can be defined on the basis of the above facts.

According to the present invention, in summary, the present invention is capable of implementing the semiconductor device with high packing density without causing any damage on the semiconductor substrate even though a lot of small-diameter electrodes is mounted.

While preferred embodiments of the present invention have been described, it is to be understood that the invention is to be defined by the appended claims when read in light of the specification and when accorded their full range of equivalent.

What is claimed is:

1. A semiconductor device comprising:

a first semiconductor pellet having at least a flat electrode; and a second semiconductor pellet having at least a protruded electrode directly connected with said flat electrode;

wherein a main component of a conductive material of said protruded electrode is the same as a main component of a conductive material of said flat electrode, and the hardness of said protruded electrode is higher than the hardness of said flat electrode.

2. A semiconductor device comprising:

a first semiconductor pellet having at least a flat electrode; and a second semiconductor pellet having at least a protruded electrode directly connected with said flat electrode;

wherein a main component of a conductive material of said protruded electrode is the same as a main component of a conductive material of said flat electrode, and the hardness of said protruded electrode is higher than the hardness of said flat electrode, wherein the hardness of said protruded electrode is 20 Hv (Vickers hardness) or more higher than the hardness of said flat electrode.

3. A semiconductor device comprising:

a first semiconductor pellet having at least a flat electrode; and a second semiconductor pellet having at least a protruded electrode directly connected with said flat electrode;

wherein a main component of a conductive material of said protruded electrode is the same as a main component of a conductive material of said flat electrode, and the hardness of said protruded electrode is higher than the hardness of said flat electrode, wherein said flat electrode is a metal electrode and said protruded electrode is an alloy electrode, said alloy consisting essentially of said metal.

4. A semiconductor device as claimed in claim 3, wherein said metal constitutes 99% or more by weight of the alloy.

5. A semiconductor device as claimed in claim 4, wherein said metal is gold.

6. A semiconductor device as claimed in claim 3, wherein said alloy includes palladium.

7. A semiconductor device comprising:

a first semiconductor pellet having at least a flat electrode; and a second semiconductor pellet having at least a protruded electrode directly connected with said flat electrode;

wherein a main component of a conductive material of said protruded electrode is the same as a main component of a conductive material of said flat electrode, and the hardness of said protruded electrode is higher than the hardness of said flat electrode, wherein said flat electrode is made of a conductive material subjected to an annealing treatment so as to decrease the hardness of said flat electrode.

8. A semiconductor device comprising:

a first semiconductor pellet having at least a flat electrode; and a second semiconductor pellet having at least a protruded electrode directly connected with said flat electrode;

wherein a main component of a conductive material of said protruded electrode is the same as a main component of a conductive material of said flat electrode, and the hardness of said protruded electrode is higher than the hardness of said flat electrode, wherein a thickness of said flat electrode is sufficient to prevent the tip portion or me protruded electrode from penetrating through the flat electrode.

9. A semiconductor device comprising:

a first semiconductor pellet having at least a flat electrode; and a second semiconductor pellet having at least a protruded electrode directly connected with said flat electrode;

wherein a main component of a conductive material of said protruded electrode is the same as a main component of a conductive material of said flat electrode, and the hardness of said protruded electrode is higher than the hardness of said flat electrode, wherein at least one of said protruded electrode and said flat electrode is a plated electrode so as to cause the difference between the hardness of said flat electrode and said protruded electrode.

* * * * *